United States Patent [19]

Fujita

[11] 4,418,469
[45] Dec. 6, 1983

[54] METHOD OF SIMULTANEOUSLY FORMING BURIED RESISTORS AND BIPOLAR TRANSISTORS BY ION IMPLANTATION

[75] Inventor: Tsutomu Fujita, Hirakata, Japan

[73] Assignee: Matsushita Electric Industrial Co., Ltd., Kadoma, Japan

[21] Appl. No.: 349,532

[22] Filed: Feb. 17, 1982

Related U.S. Application Data

[63] Continuation of Ser. No. 137,462, Apr. 4, 1980, abandoned.

[30] Foreign Application Priority Data

Apr. 12, 1979 [JP] Japan .................................. 54-44927

[51] Int. Cl.³ .......................................... H01L 21/74
[52] U.S. Cl. .............................. 29/577 C; 29/576 B; 29/578; 148/1.5; 357/34; 357/51
[58] Field of Search .......... 148/1.5; 29/576 B, 577 C, 29/578; 357/51, 89, 90, 91, 20, 34

[56] References Cited

U.S. PATENT DOCUMENTS 4,021,270  5/1977  Hunt et al. .......................... 148/1.5
4,075,039  2/1978  Sloan, Jr. ............................ 148/1.5
4,228,450 10/1980  Anantha et al. ....................... 357/51

Primary Examiner—Brian E. Hearn
Assistant Examiner—Alan E. Schiavelli
Attorney, Agent, or Firm—Cushman, Darby & Cushman

[57] ABSTRACT

A method of making at a relatively low temperature, a resistor region of a high sheet resistance, solely or together with other circuit devices such as bipolar transistors in an IC chip, with the step of forming a buried resistor layer inside a semiconductor substrate at a predetermined depth by an ion implantation, wherein the resultant resistor region has a well-controlled high sheet resistance and the obtained bipolar transistors have a well-improved high frequency characteristics.

13 Claims, 34 Drawing Figures

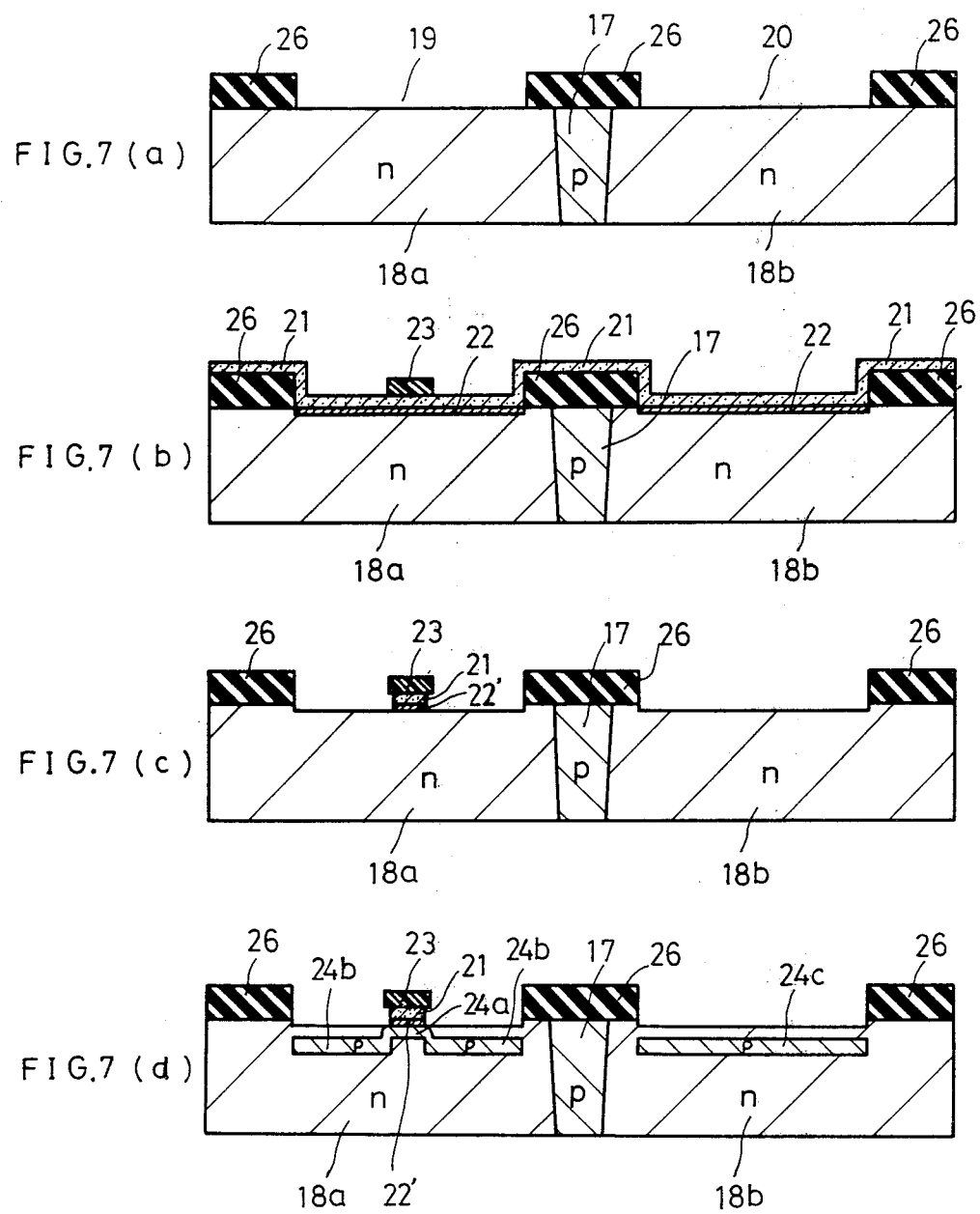

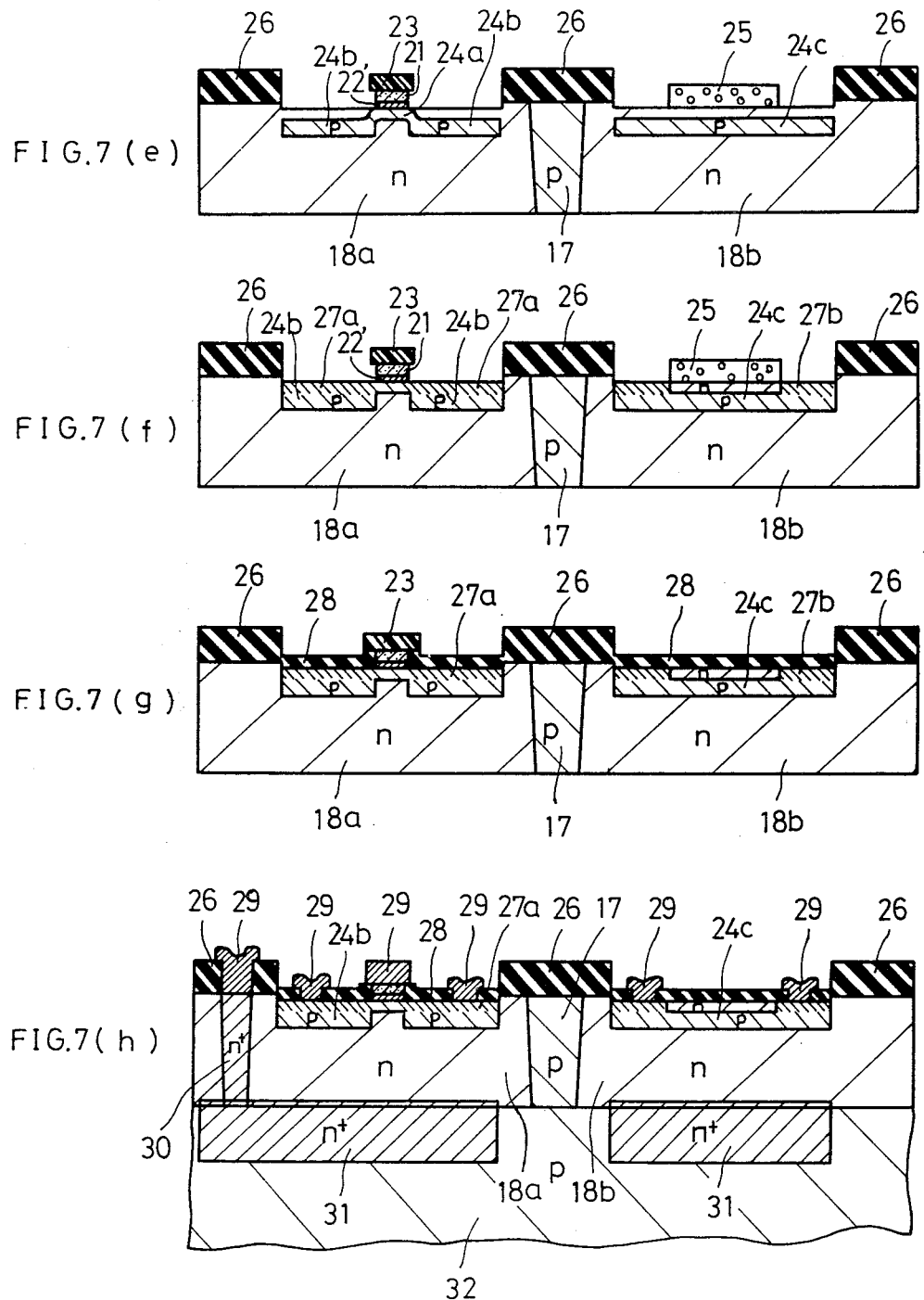

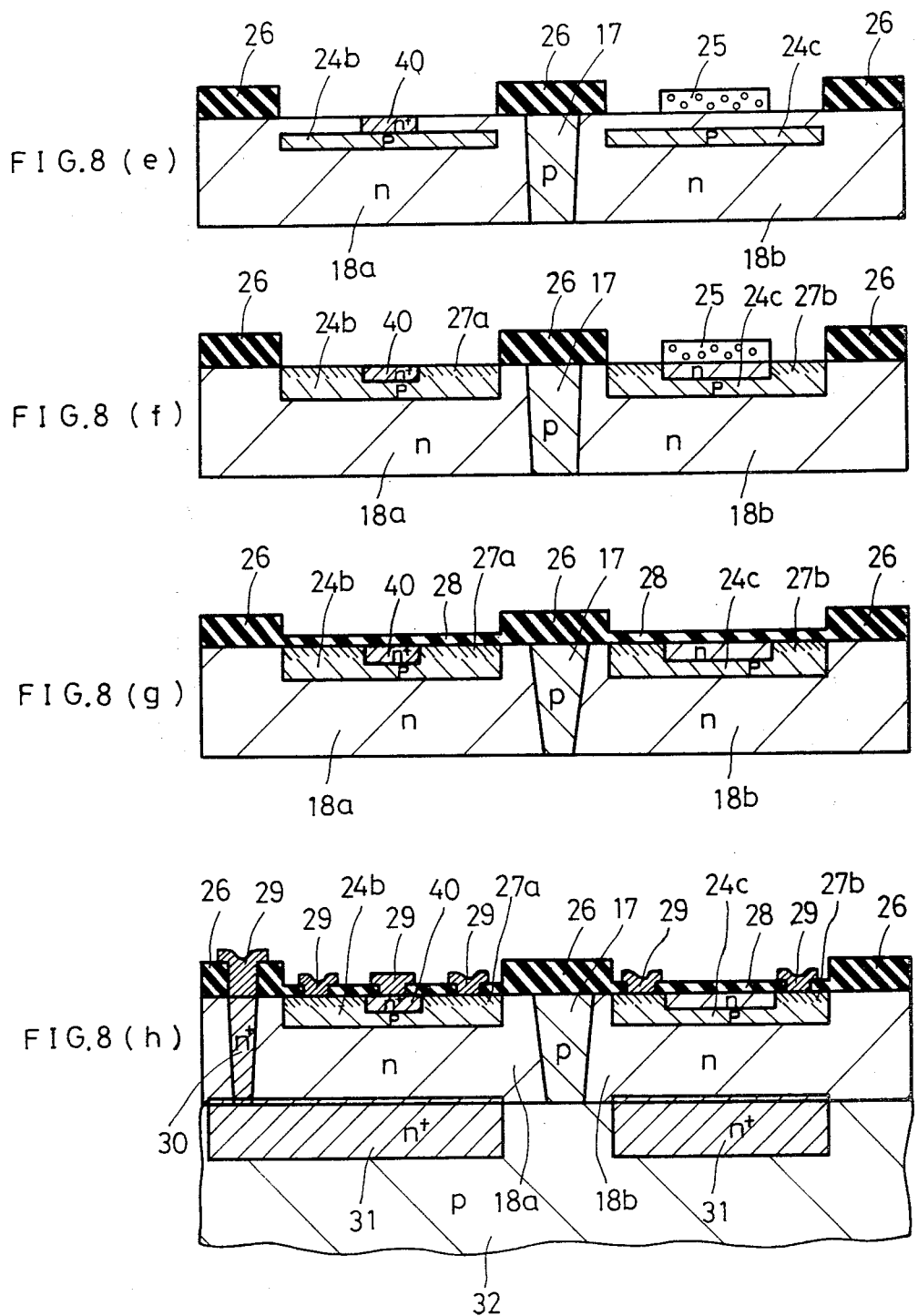

METHOD OF SIMULTANEOUSLY FORMING BURIED RESISTORS AND BIPOLAR TRANSISTORS BY ION IMPLANTATION

This is a continuation of application Ser. No. 137,462 filed Apr. 4, 1980, now abandoned.

BACKGROUND OF THE INVENTION

1. Field of the Technology

This invention relates to a method of making semiconductor integrated circuit devices, more particularly to a method of making semiconductor integrated circuit devices comprising resistance devices of a high sheet resistance.

2. Prior Art

Conventionally, a diffusion resistor having a sheet resistance of 200–500Ω/□ has been often used as a resistor in semiconductor integrated circuit devices (hereinafter referred to as IC devices). When a resistor having a resistance more than 10KΩ is formed by using such a resistor having a low sheet resistance, the resultant resistor necessitates a large area in an IC device, thereby resulting in increase of a stray capacitance. Therefore, it is difficult in the conventional IC device to increase the integration degree and to obtain a high operational speed therein.

An example of the conventional method of making a resistor having a high sheet resistance in an IC device is elucidated by referring to FIG. 1(a)–FIG. 1(e). These figures are cross-sectional views illustrating the belowmentioned steps A to E of the conventional making method:

Step A: As a first step, a semiconductor substrate 1 of e.g. n-type single crystalline silicon is oxidized to form an oxide film layer. By a known photoetching method, windows 3 are opened to form impurity layers 4, thus the oxide layer is divided into oxide layers 2 and 2'. Impurity atoms, e.g. boron of a high concentration are diffused through the windows 3 to form the impurity layers 4 to be in contact with a resistor region at a large depth. The above impurity diffusion is carried out by a heat treatment at a high temperature between 1,050°–1,150° C.—FIG. 1(a).

Step B: The oxide layer 2' is removed and a window 5 is formed by a known photoetching method, as a preparatory step prior to the formation of a resistor layer of a high sheet resistance—FIG. 1(b).

Step C: Impurity atoms, e.g. boron of a low concentration are introduced into the substrate through the window 5 by an ion implantation or a diffusion method, thus forming a resistor layer 6 of a high sheet resistance—FIG. 1(c).

Step D: The surface of the resistor layer 6 is oxidized to form an oxide film layer 7—FIG. 1(d).

Step E: After forming openings at the oxide film layer 7, contact electrodes 8 are formed to obtain electrical contact with the diffused impurity layers 4—FIG. 1(e).

The abovementioned conventional method of FIG. 1 has a drawback that controllability of the obtainable sheet resistance of the resistor layer 6 is imperfect since some parts of the impurity atoms for the resistor layer 6 are taken into the oxide film layer 7 when the surface of the resistor layer 6 is oxidized in the step D.

Another conventional method of making a resistor layer having a high sheet resistance in an IC device by use of an ion implantation is elucidated below by referring to FIG. 2(a)–FIG. 2(e). These figures are cross-sectional views illustrating the belowmentioned steps A to E of the second conventional making method:

Step A: As a first step, a semiconductor substrate 1 of e.g. n-type single crystalline silicon is oxidized to form an oxide film layer 2. A window 3 is then opened by a known photoetching method. A p-type impurity layer 4' is formed by an ion implantation of e.g. boron ions—FIG. 2(a).

Step B: The p-type impurity layer 4' is turned to a p-type thick layer 4" after a heat treatment at a high temperature. During the heat treatment, the surface of the p-type impurity layer 4' is also oxidized—FIG. 2(b).

Step C: An opening 5' is formed by a photoetching method. An n+-type layer 6' lying shallower inside the p-type thick layer 4" is formed by an ion implantation through the opening 5'—FIG. 2(c).

Step D: The n+-type layer 6' is turned to an n+-type thick layer 6" after a high temperature treatment, during which treatment the surface of the n+-type layer 6' is also oxidized. A p-type layer 7' lying between the n+-type thick layer 6" and the n-type substrate 1 serves as a resistor region of a high sheet resistance. Both side ends of the p-type layer 7' are used as contact regions 71—FIG. 2(d).

Step E: Contact windows are formed on the contact regions 71 and then contact electrode bumps 8 are formed—FIG. 2(e).

The abovementioned second conventional method of FIG. 2 has the following problems.

The resistances of several resistor regions 7', each prepared by the second conventional method, differ from each other, since the ion implantation is made twice by using two kinds of impurity ions of opposite conductivity types. In addition, since the p-type layer 7' of a high sheet resistance is formed as a result of the depth difference between the n+-type thick layer 6" and the p-type thick layer 4", the depths of both layers 6" and 4" must be strictly controlled. As shown in FIG. 3 (which is a graph showing impurity distribution profiles on a log scale after the ion implantation steps), the bottom front of the n+-type thick layer 6" and that of the p-type thick layer 4" are set to be $x_1$ and $x_2$, respectively. The impurity distribution profiles of the n+-type thick layer 6" and the p-type thick layer 4" are shown by curves $\overline{6}$ and $\overline{4}$, respectively. The impurity distribution profile shown by the curve $\overline{6}$ takes into account the compensation effect by the p-type impurity atoms in the p-type thick layer 4". The impurity distribution profile without such a compensation effect would be shown by a dotted curve $\overline{6'}$. The two curves $\overline{6}$ and $\overline{4}$ intersect with each other, thus the resultant compensated distribution profile for the p-type layer 7' shown by a curve $\overline{7}$ has a peak point "a". Accordingly, the resistance of the p-type layer 7' is determined by the depths $x_1$ and $x_2$ and the position of the point "a". This means that there are three parameters for the resistance determination of the p-type layer 7'. Therefore, the resistance control is bad.

SUMMARY OF THE INVENTION

The present invention provides a method of making at a relatively low temperature, a resistor region of a high sheet resistance solely or together with other circuit devices such as bipolar transistors in an IC device, wherein the obtainable resistor has a well-controlled high sheet resistance and the obtained transistors have a well-improved high frequency characteristic.

BRIEF EXPLANATION OF THE DRAWINGS

FIGS. 7(a)–7(h) and FIGS. 8(a)–8(h) are cross-sectional views showing several steps of other embodiments of the present invention, wherein resistor regions are formed together with the formation of bipolar transistors.

DETAILED DESCRIPTION OF PREFERRED EMBODIMENT

Figures 1A, 1B, 1C, 1D, 1E:
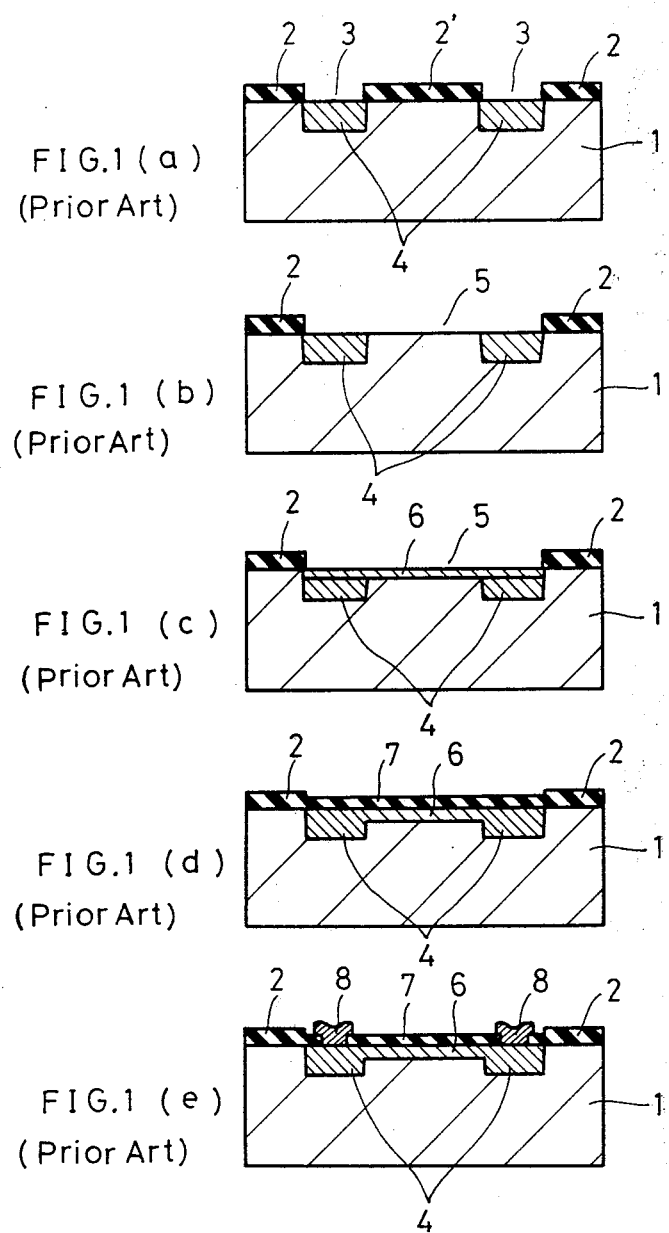
FIG. 1(a) to FIG. 1(e) are cross-sectional views illustrating several steps of a conventional making method.
Figure 2:
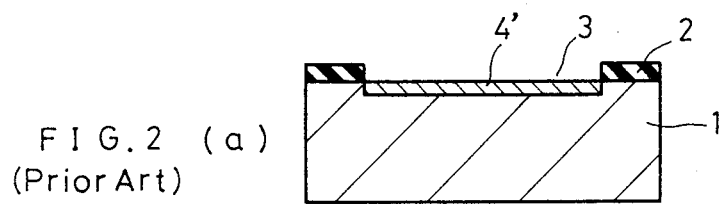
FIG. 2(a) to FIG. 2(e) are cross-sectional views illustrating several steps of another conventional making method.
Figure 2:
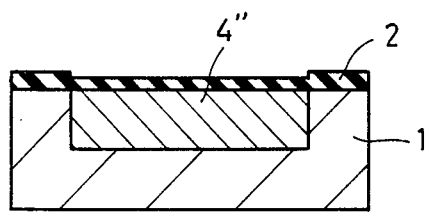
Figure 2:
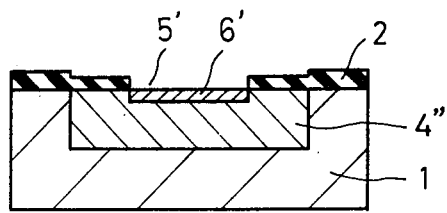
Figure 2:
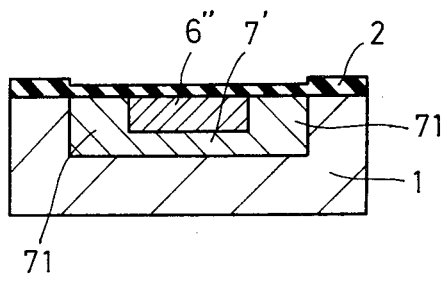
Figure 2:
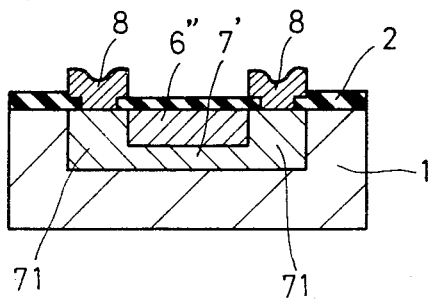
Figure 3:
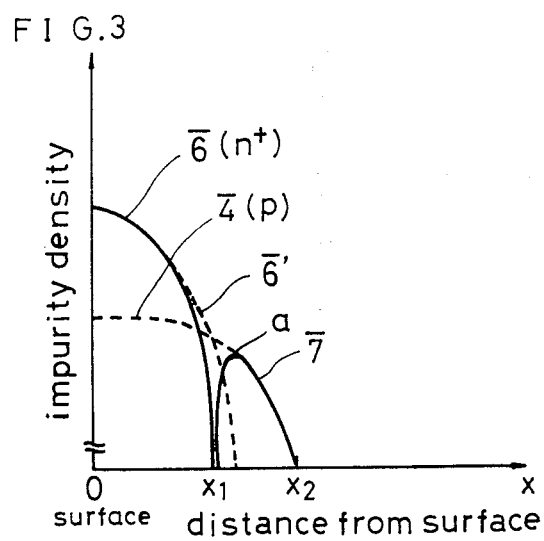
FIG. 3 is a graph showing impurity distribution profiles after two ion implantation steps of FIG. 2.

A method of making semiconductor integrated circuit devices of the present invention comprises the steps of selectively forming contact regions of a first conductivity type in predetermined regions at the surface of a semiconductor substrate of a second conductivity type opposite to said first conductivity type, and forming a buried resistor layer of said first conductivity type inside said semiconductor substrate by an ion implantation in such a manner that side end parts of said buried resistor layer contact said contact regions.

The making method of the present invention can overcome the abovementioned problems in the conventional method of making a resistor region of a high sheet resistance. A first embodiment of the present invention is elucidated by referring to FIG. 4(a)–FIG. 4(e). FIG. 4(a)–FIG. 4(e) are cross-sectional views illustrating the belowmentioned steps A to F of a making method embodying the present invention.

Step A: A semiconductor substrate 11 of e.g. n-type single crystalline silicon is oxidized, and an oxide film layer 9 is formed thereon. An opening window 10 is formed at the oxide film layer 9 by a known photoetching method—FIG. 4(a).

Step B: A p-type buried layer 12 of a high sheet resistance is formed inside the semiconductor substrate 11 by an ion implantation of e.g. boron atoms. When the ion implantation is made by an implantation energy of 150–300 KeV, the center of the impurity distribution for the buried layer 12 lies at a depth of 0.4–0.6 $\mu$m. The scattering $\Delta R_p$ of the impurity distribution from the center is little (0.1 $\mu$m), and therefore a surface region 11' at the opening window 10 is compensated only little, thus retained its conductivity to be n-type. A dose amount in the ion implantation is selected to make the impurity concentration between $5 \times 10^{12}$ atoms/cm$^2$ and $2 \times 10^{13}$ atoms/cm$^2$, when it is required to obtain a sheet resistance of 1–3K$\Omega$/□—FIG. 4(b).

Step C: A photoresist layer 13 to be used as a mask in a subsequent ion implantation is selectively formed on the substrate surface above the buried high sheet resistance layer 12—FIG. 4(c). In this embodiment, contact regions 14, 14 of FIG. 4(d) are formed by the subsequent ion implantation, thus there is no need to employ a mask of an oxide film, which would be used in the forming of contact regions by a diffusion method.

Step D: Impurity atoms such as boron are implanted under the condition of a low energy (40–60 KeV) and a high dose amount ($5 \times 10^{14} - 2 \times 10^{15}$ atoms/cm$^2$) by using the photoresist layer 13 and the oxide film layer 9 as masks. The n-type surface region 11' of the substrate 11 under the photoresist layer 13 is retained unchanged, but the n-type surface regions above both side ends of the buried high sheet resistance layer 12 are compensated as a result of the ion implantation and are turned to p-type layers 14, 14 of a low sheet resistance (200–50$\Omega$/□)—FIG. 4(d). The ion implantation is made in such a manner that the resultant p-type layers 14 well contacts the side ends of the buried high sheet resistance layer 12. Since the buried high sheet resistance layer 12 is ion-implanted in step B, spreading of the implanted impurity distribution in the horizontal direction is little. Further, since the length of the resistor region (the buried high sheet resistance layer 12) is precisely controlled by the pattern size of the photoresist layer 13, the resistor region formed by the buried high sheet resistance layer 12 has a precisely controlled high sheet resistance.

Step E: After removing the photoresist layer 13, the semiconductor substrate 11 is annealed at a low temperature of about 800° C., followed by an oxidation process on the surface of the semiconductor substrate 11 in an oxygen atmosphere containing steam at a relatively low temperature (800°–1,000° C.). Thereby an oxide film 15 is finally formed—FIG. 4(e).

Step F: Contact windows are formed at the oxide film 15, and then contact electrode bumps 16, 16 are formed by use of a metal such as Al to secure electrical contact with the resistor region, i.e. the buried high sheet resistance layer 12—FIG. 4(e).

In the abovementioned steps of the method embodying the present invention, it may also be possible to oxide the substrate surface above the region to be a resistor region prior to the ion implantation of boron in step B. In such a case, it is preferable to form a silicon dioxide layer of 2000 Å, or thinner for an ion implantation energy of 160 KeV. It is further possible to form the p-type layers 14 as the contact regions prior to the ion implantation for the buried high sheet resistance layer 12. In this case, it is not always necessary to carry out the ion implantation, but a thermal diffusion is also applicable to obtain the p-type layers 14.

The distinctive features of the method embodying the present invention are described in detail below: The conventional problems of loss of impurity atoms due to impurity diffusion into the oxide film can be overcome, for example, by setting the thickness of the oxide film 15 to be thinner than about 4,000 Å, and implanting boron atoms of $2 \times 10^{13}$ ions/cm$^2$ into an n-type silicon substrate of 1$\Omega$.cm resistivity by an implantation energy of 160 KeV. This situation is depicted in FIG. 5, which is a graph showing an impurity distribution profile obtained in the steps of the method embodying the present invention.

The impurity distribution profile for the buried high sheet resistance layer 12 is illustrated by a curve $\overline{12}$. The hatched regions of 0–2,000 Å in thickness both from the original surface of the semiconductor, i.e. Si substrate 11, are a SiO$_2$ film (the oxide film 15) of a thickness totalling to 4,000 Å. As clearly shown in FIG. 5, the implanted boron atoms for the formation of the buried high sheet resistance layer 12 are controlled to be buried completely inside the semiconductor substrate 11, according to the method of FIG. 4. Therefore, the impurity distribution profile of the curve $\overline{12}$ is not affected by the formation of the oxide film 15, thereby retaining the high sheet resistance of the buried layer 12.

Figure 5:
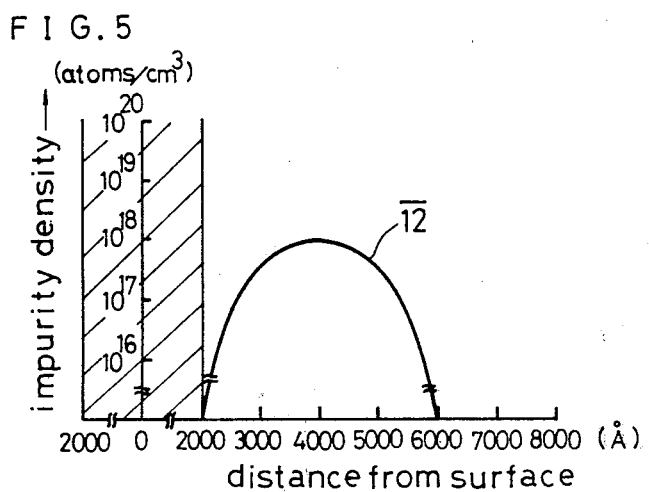
FIG. 5 and FIG. 6 are graphs showing impurity distribution profiles obtained in the steps of the method embodying the present invention.
Figure 6:
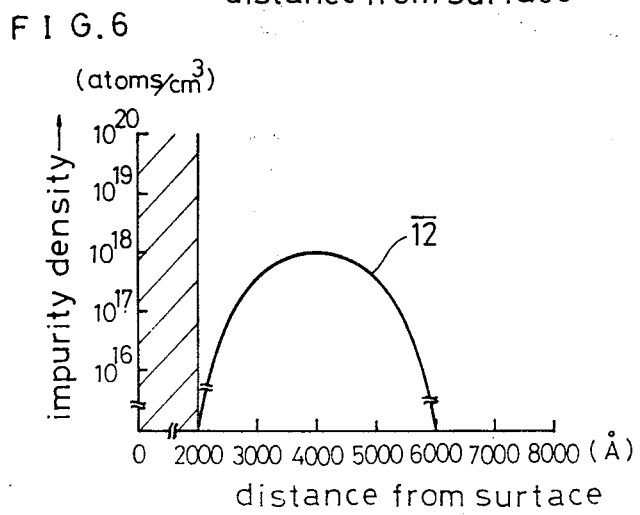
Figure 4:
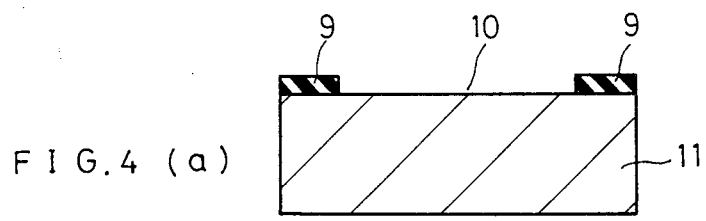
FIG. 4(a) to FIG. 4(e) are cross-sectional views showing several steps in accordance with a first embodiment of the present invention.
Figure 4:
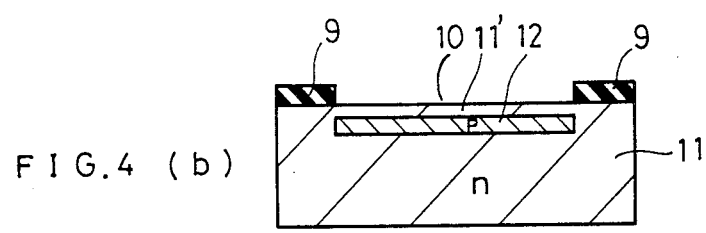
Figure 4:
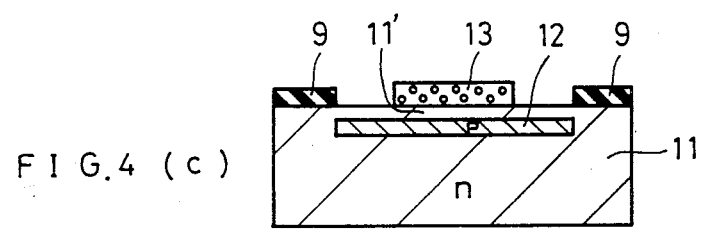
Figure 4:
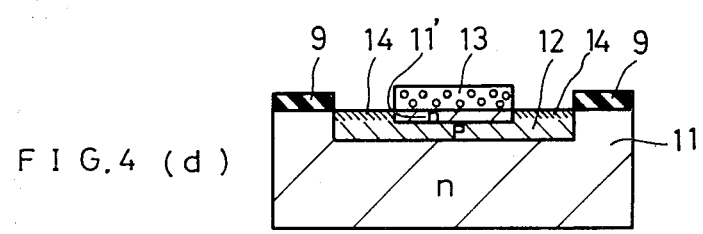
Figure 4:
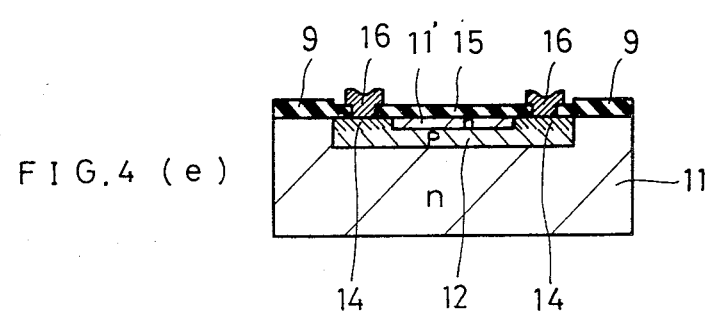
Figure 8:
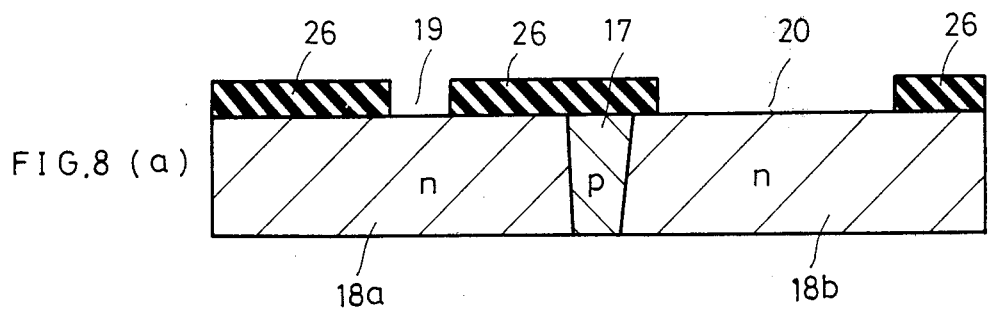
Figure 8:
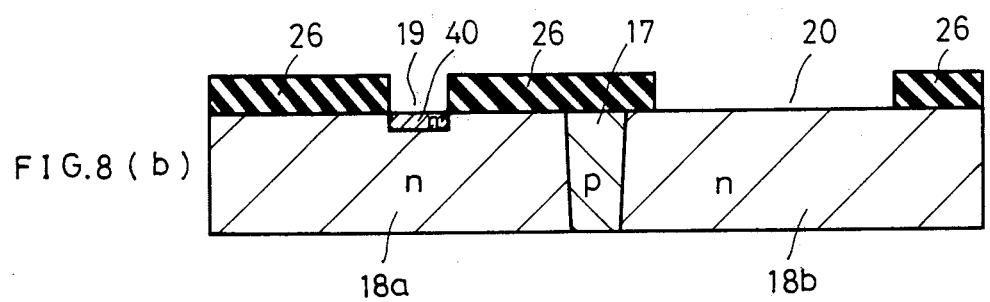
Figure 8:
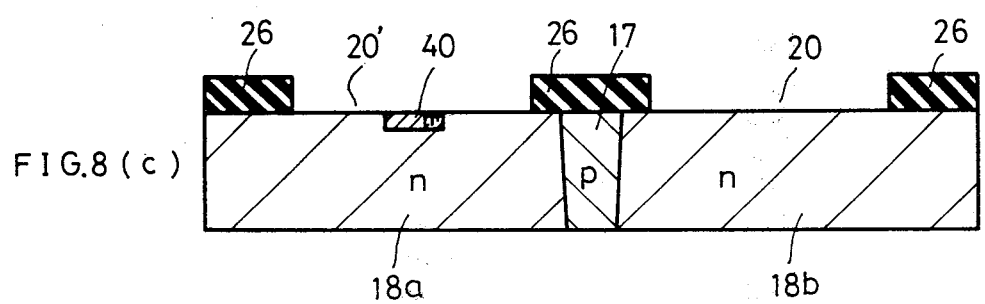
Figure 8:
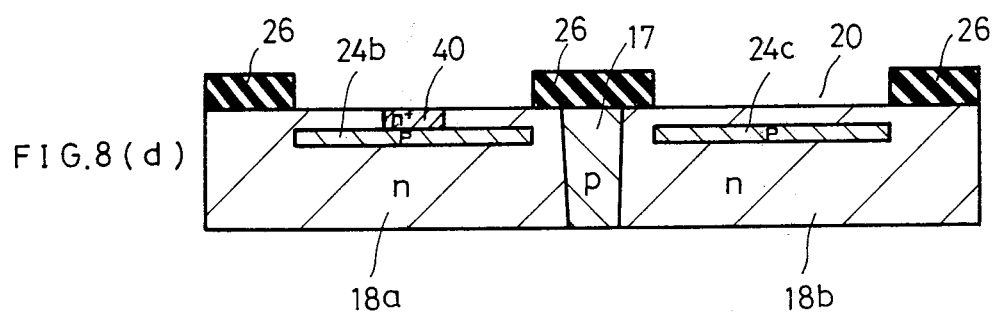

On the other hand, when the oxide film 15 is grown prior to the ion implantation of the buried high sheet resistance layer 12 under the same condition as the case of FIG. 5, the high sheet resistance thereof is not affected by the existence of the oxide film 15, if the thickness thereof is thinner than 2,000 Å. This situation is also depicted in FIG. 6, which is a graph illustrating an impurity distribution profile indicated by a curve $\overline{12}$. This means that the oxide film 15 does not affect the distribution profile $\overline{12}$, when the ion implantation after the formation of the oxide film 15 is carried out in such a manner that the impurity distribution profile of the curve $\overline{12}$ lies inside the semiconductor substrate 11.

The distinctive features of the method in accordance with the first embodiment as compared with the prior arts are summarized below.

(1) The method is free from the conventional problem accompanying with the impurity distribution change due to the silicon dioxide film, since the buried high sheet resistance layer 12 is formed deep inside the bulk substrate by use of a high ion implantation energy thereby retaining the conductivity type of the surface region of the substrate 11 unchanged. Accordingly, the obtained resistor layer has a well-controlled high sheet resistance, although the impurity density of the buried resistor layer is low.

(2) The resistance control of the buried high sheet resistance 12 is superior since it is formed in the single ion implantation step.

(3) The buried high sheet resistance layer 12 is formed not by the thermal diffusion, but by the ion implantation thus necessitating no thermal treatment at a high temperature above 1,000° C. Therefore, the impurity distribution profile of the buried high sheet resistance layer 12 is not changed, thus maintaining a high impurity density region in a limited narrow depth stretch.

In general, carrier conduction in a semiconductor layer is primarily affected by the lattice scattering and the impurity scattering. And, the thermal characteristic of the resistance variation in a resistor layer is determined primarily by the lattice scattering rather than the impurity scattering as the impurity density decreases much in the resistor layer (in other words, carrier conduction in a layer containing high density impurities is primarily determined by the impurity scattering). Thus, the resistance of a high sheet resistance layer is conventionally inferior in the thermal characteristic due to the lattice scattering effect dependent on the ambient temperature.

The buried high sheet resistance layer 12 formed by the method embodying the present invention is superior in the thermal characteristic of the resistance variation, since the layer of a high impurity density is buried in the narrow depth stretch region.

This feature is further analyzed below. When a buried high sheet resistance layer 12 is formed in an n-type silicon substrate of 1Ω.cm resistivity by a boron ion implantation of $2 \times 10^{13}$ ion/cm² at 160 KeV, the resultant resistor layer has a sheet resistance of 1.5KΩ/□. The impurity distribution profile of this layer is like the one shown by the curve $\overline{12}$ in FIG. 5. The highest obtainable impurity density in the bulk is $1 \times 10^{18}$ atoms/cm³ thus resulting in a resistance variation of about 2,500 ppm/°C. in the thermal characteristic. This resistance variation is much smaller than that of the conventional resistor layer.

On the other hand, if a resistor layer having such a low resistance variation were made by a conventional thermal diffusion, the following conditions would be necessary for the resistor layer:

Diffusion depth—3 μm (for boron atoms),
a sheet resistance—200Ω/□.

If the abovementioned resistor layer by the thermal diffusion were used to form a buried resistor layer of such a high sheet resistance as obtained by the method embodying the present invention, the resistor layer would necessitate a large area 7.5 times as large as that of the buried high sheet resistance layer. As for the impurity density, if a resistor layer having a high sheet resistance of 1.5KΩ/□ and a diffusion depth of 2 μm were obtained by a thermal diffusion, the highest impurity density therein would be about $2 \times 10^{17}$ atoms/cm³. As a result of such a low impurity density, the resistance variation in the thermal characteristic would become about 5,000 ppm/°C., that is twice as large as the variation obtainable by the method embodying the present invention.

In accordance with the method embodying the present invention, the high density impurity atoms distribute in a narrow region in the depth direction of the substrate. The method is characterized in that the impurity distribution profile at the ion implantation is retained, since the method does not require a thermal treatment at a high temperature. Therefore, according to the present invention, a high sheet resistance is obtainable together with a small resistance variation in the thermal characteristic.

(4) The high sheet resistance is hardly affected by the scattering of the bulk impurity density in the substrate. This is because the high density impurity atoms distribute in the narrow region, so that the compensation with the impurity atoms in the bulk occurs only in a limited area.

This situation is also exemplified below. The buried high sheet resistance layer obtained above by a boron ion implantation of $2 \times 10^{13}$ ions/cm² at 160 KeV has an impurity distribution profile as shown by the curve $\overline{12}$ in FIG. 5. That is, the implanted boron atoms distribute with a narrow range of depth of about 4,000 Å from the surface into the bulk. On the contrary, if a resistor layer of about 2 μm in thickness were made by a thermal diffusion of boron atoms, the diffused boron atoms would be compensated by the impurities in the bulk in a large area, five times as large as that of the buried high sheet resistance layer. Thus, the buried high sheet resistance layer is hardly affected by the scattering of the bulk impurity distribution.

(5) The resistance control is further improved by the fact that the area of the region to become the buried high sheet resistance layer is accurately determined by the pattern size of the photoresist layer 13 since the implanted atoms do not spread under the photoresist layer 12 and outside the contact regions 14.

As described so far, the present invention provides the method of making a buried high sheet resistance layer, which is superior in several respects as compared with the conventional resistor layer. Such distinctive features are more particularly advantageous when it is made together with other circuit devices such as transistors. When a resistor device is formed together with a transistor in one IC chip by a conventional method, the formation of an emitter region of the transistor following the formation of the resistor device requires a thermal treatment at a high temperature thereby affecting the impurity distribution profile. This leads to the variation of the resistance per se and the increase of the resistance variation in the thermal characteristic.

On the contrary, a high sheet resistance layer can be made by the method of the present invention without a high temperature thermal treatment. Therefore, it can be made together with a transistor without affecting characteristics of the transistor during the forming process. Such a novel method of making a combination of a high sheet resistance layer and a bipolar transistor is elucidated as a second embodiment of the present invention, by referring to FIG. 7(a)–FIG. 7(h). FIG. 7(a) to FIG. 7(h) are cross-sectional views illustrating the following steps A to H of the method embodying the present invention.

Step A: A p-type isolation layer 17 is formed in an n-type single crystalline silicon layer on a p-type silicon substrate 32 (not shown except in FIG. 7(h)). The n-type silicon layer with n-type island regions 18a and 18b are oxidized thus resulting in an oxide film 26. An opening window 19 for a base region and an opening window 20 for a resistor region are formed in the oxide film 26 by a conventional photoetching technique—FIG. 7(a).

Step B: After depositing a poly-crystalline silicon layer 21 on the entire surface, n-type impurities are diffused into the island regions 18a and 18b from the poly-crystalline silicon layer 21 thereby forming an n+-type layer 22. The n-type impurities are preferable to have a small diffusion coefficient like arsenic atoms. Then, an oxidation-resistant film 23, e.g. nitride film, is selectively formed to form an emitter pattern—FIG. 7(b).

Step C: The poly-crystalline silicon layer 21 and the n+-type diffused layer 22 are selectively etched away by use of the oxidation-resistant film 23 as an etching mask thereby forming a protruded emitter region 22'—FIG. 7(c).

Step D: P-type layers 24a, 24b and 24c are formed by an ion implantation of e.g. boron. The p-type layer 24a is to be used as an active base region of the bipolar transistor. The p-type layers 24b are to be used as non-active base regions in contact with the p-type layer 24a. The p-type layer 24c is to be a buried high sheet resistance layer. In this case, the depth of the p-type layers 24b and 24c from the bulk surface is controlled to be 0.5–0.7 $\mu$m by an implantation energy of 150–300 KeV so that no junction breakdown occurs in a conventional Al sintering process.

In addition, the total thickness of (the oxidation-resistant film 23)+(the poly-crystalline silicon—layer 21)+(the emitter region 22') is predetermined in such a manner that a thin depth range of 0.15–0.3 $\mu$m is obtainable for the active base region 24a by an implantation energy of the abovementioned range. Surface regions have the p-type layers 24b and 24c are not turned to be p-type. A dose amount of the ion implantation is selected to be $5 \times 10^{12}$ atoms/cm$^2$–$2 \times 10^{13}$ atoms/cm$^2$ to result in a high resistance (1–3 K$\Omega$/□) by the buried high sheet resistance layer and besides a suitable impurity density in the base region for a sufficiently large current amplification factor—FIG. 7(d).

Step E: A mask for the subsequent ion implantation is selectively formed on the bulk surface above a region to become a buried high sheet resistance layer, by coating the surface with e.g. a photoresist film 25—FIG. 7(e).

Step F: Impurity atoms, e.g. boron atoms of a high dose amount ($5 \times 10^{14}$ atoms/cm$^2$–$2 \times 10^{15}$ atoms/cm$^2$) are implanted at a low energy of 40–60 KeV by use of the photoresist film 25 and the oxide film 26 as masks, and the oxidation-resistant film 23 and the oxide film 26 as other masks. The region of the p-type layers 24c under the photoresist film 25 is retained to be the buried high sheet resistance layer 24c. On the other hand, the p-type layers 27a and 27b containing implanted high density boron atoms become p-type resistor layers of a low sheet resistance (200–50 $\Omega$/□). Accordingly, the p-type layers 27a and 24b, and the p-type layers 27b and 24c contact each other, respectively, thus forming together p-type deep contact regions. The p-type layers 27a are p-type contact regions of a high impurity density used for the non-active base regions around the active base region 24a. The p-type regions 27b are p-type contact regions for the buried high sheet resistance layer 24c. The non-active base regions are not in direct contact with the emitter region 22'—FIG. 7(f).

Step G: After removing the photoresist film 25, the substrate is annealed at a low temperature of about 800° C. The substrate surface is further oxidized by using the oxidation-resistant film 23 as a mask with the oxygen gas containing steam of a relatively low temperature of 800°–1,000° C., thereby coating the surface with oxide films 28, 28—FIG. 7(g). The impurity distribution profile of the implanted boron atoms is scarcely affected during those thermal treatments, as described above.

Step H: After removing the oxidation-resistant film 23, contact windows are formed in the oxide films 28, 28 and contact electrode bumps 29, 29 are formed by use of a metal, e.g. Al—FIG. 7(h). The p-type semiconductor substrate 32 is shown in FIG. 7(h) together with an n+-type collector wall and n+-type buried layers 31, 31. These n+-type regions are formed in advance, prior to the step A by a conventional method.

As alternative steps for the abovementioned steps A–H, it is also possible to employ other steps. For example, prior to the ion implantation in the step D, it is also possible to grow an oxide film on the substrate surface. In this case, the substrate surface is hardly damaged at the ion implantation, and besides the oxidation process at the step G can be omitted. In addition, the resistor layer and the bipolar transistor can be formed by the following method instead of the processing order from the step D to the step F. That is, it is also possible to form an active base region and a buried high sheet resistance layer, after forming contact regions for non-active base regions and the resistor layer.

The so far described method in accordance with the second embodiment of the present invention has the following distinctive features.

(1) The resistor layer and the bipolar transistor can be simultaneously formed in one IC chip without increasing the number of the process steps.

(2) Since the base region is formed by two ion implantation steps after the formation of the emitter region, the process does not require a thermal treatment at a high temperature, and thus there is no problem of affecting the impurity distribution in the emitter region. In addition, since the depth range of the active base region is determined by the impurity distribution at the ion implantation. Therefore, it is possible to obtain a well-controlled depth range of the base region, and thus a bipolar transistor superior in the high frequency characteristics is obtainable.

(3) Since the non-active base regions of a high impurity density are formed extremely near the emitter region, the base resistance is small. In addition, since the emitter region has a protruded shape and no thermal treatment at a high temperature above 1,000° C. is necessary in the method of the present invention, the base region of a high impurity density does not directly contact the emitter region thereby increasing the breakdown voltage between the emitter and base regions.

A third embodiment in accordance with the present invention is elucidated below by referring to FIG. 8(a)-FIG. 8(h). These figures are cross-sectional views illustrating the following steps A to H. The steps A to H of FIGS. 8(a)-8(h) are similar respectively to the steps A to H of FIGS. 7(a)-7(h). A buried emitter region is formed in FIGS. 8(a)-8(h), different from the protruded emitter region in FIGS. 7(a)-7(h).

Step A: A p-type isolation layer 17 is formed in an n-type single crystalline silicon layer on a p-type silicon substrate 32 (not shown except in FIG. 8(h)). The n-type silicon layer with n-type island regions 18a and 18b are oxidized thus resulting in an oxide film 26. An opening window 19 for an emitter region and an opening window 20 for a resistor layer are formed in the oxide film 26—FIG. 8(a).

Step B: An n+-type emitter region 40 is formed through the opening window 19—FIG. 8(b).

Step C: An opening window 20' is formed—FIG. 8(c).

Step D: An active base layer 24b and a resistor layer 24c are simultaneously formed in the island regions 18a and 18b, respectively, by an ion implantation of e.g. boron—FIG. 8(d).

Step E: A photoresist film 25 is selectively formed above the resistor layer 24c-FIG. 8(e).

Step F: P-type contact regions 27a for the base layer 24b and p-type contact regions 27b for the resistor layer 24b are simultaneously formed by another ion implantation of e.g. boron—FIG. 8(f).

Step G: The bulk surface is further oxidized resulting in oxide films 28, 28—FIG. 8(g).

Step H: Contact electrode bumps 29, 29 are formed at one time—FIG. 8(h). The p-type silicon substrate 32 has n+-type buried regions 31, 31. An n+-type region 30 is a collector wall.

The abovementioned third embodiment has the following distinctive features.

(1) The resistor layer and the bipolar transistor can be simultaneously formed in one IC chip without increasing the number of the process steps.

(2) Since the base region is formed by two ion implantation steps after the formation of the emitter region, the process does not require a thermal treatment at a high temperature, and thus there is no problem of affecting the impurity distribution in the emitter region. In addition, since the depth range of the active base region is determined by the impurity distribution at the ion implantation, it is possible to obtain a well-controlled depth range of the base region, and thus a bipolar transistor superior in the high frequency characteristics is obtainable.

As described so far, the present invention can provide the method of making a high sheet resistance layer, which shows a well-controlled resistance and a small resistance variation in the thermal characteristic. The resistor layer is also obtainable together with other circuit devices, i.e. bipolar transistors. The IC devices produced by the method of the present invention are also suitable for a high integration and a high operational speed.

What is claimed is:

1. A method of making semiconductor integrated circuit devices comprising, in combination, the successive steps of:
    (A) forming a first and a second island regions of a first conductivity type,
    (B) forming an emitter region of said first conductivity type selectively in said first island region,
    (C) forming an active base region of a second conductivity type opposite to said first conductivity type under said emitter region, and a buried resistor layer of said second conductivity type in said second island region, said active base region and said buried resistor layer being formed simultaneously by an ion implantation with a first kind of ions of said second conductivity type from the surfaces of said first and said second island regions,
    (D) forming a mask for subsequent ion implantation selectively on said buried resistor layer except on contact regions to be formed in said second island region, and thereafter
    (E) forming non-active base regions so as to be in contact with said active base region, and said contact regions so as to be in contact with said resistor layer, said non-active base regions and said contact regions being formed simultaneously by another ion implantation with a second kind of ions of said second conductivity type and with a lower energy and a higher dose amount than the case of said ion implantation with said first kind of ions, from the surfaces of said first and said second island regions.

2. A method of making semiconductor integrated circuit devices comprising, in combination, the successive steps of:
    (a) forming a first and a second island regions of a first conductivity type,
    (b) forming an emitter region of said first conductivity type selectively in said first island region,
    (c) forming a mask on said second island region except on contact regions for a buried resistor layer to be formed in said second island region,
    (d) forming non-active base regions in said first island region, and contact regions in said second island region simultaneously by an ion implantation with a first kind of ions of a second conductivity type opposite to said first conductivity type, from the surfaces of said first and said second island regions,
    (e) removing said mask, and thereafter
    (f) forming an active base region under said emitter region so as to be in contact with said non-active base regions, and said buried resistor layer so as to be in contact with said contact regions, said active base region and said buried resistor layer being formed simultaneously by another ion implantation with a second kind of ions of said second conductivity type and with a higher energy and a lower dose amount than the case of said ion implantation with said first kind of ions, from the surfaces of said first and said second island regions.

3. The method in accordance with claim 1 or 2, wherein prior to the formation of said buried resistor layer an insulation film is formed on the surfaces of said first and said second island regions, and said ion implantation with said first kind of ions is made through said insulation film.

4. The method in accordance with claim 3, wherein said emitter region is formed by forming a poly-crystalline semiconductor layer and diffusing impurity atoms from said poly-crystalline semiconductor layer into said first island region.

5. The method in accordance with claim 4, wherein said ion implantation with said first kind of ions is made through said insulation film, said poly-crystalline semiconductor layer and said emitter region, so that said active base region has a thin depth range of 0.15–0.3 $\mu$m.

6. The method in accordance with claim 1 or 2, wherein said mask for said contact regions is a photoresist film.

7. The method in accordance with claim 1 or 2, wherein said non-active base regions are formed by use of said emitter region as an ion implantation mask.

8. The method in accordance with claim 1 or 2, wherein said emitter region is formed by the steps of (i) forming an impurity layer of said first conductivity type on the surfaces of said first and said second island regions, (ii) disposing an emitter pattern mask on said impurity layer, and (iii) selectively removing said impurity layer by use of said emitter pattern mask.

9. The method in accordance with claim 1 or 2, wherein said emitter region is formed by forming a poly-crystalline semiconductor layer and diffusing impurity atoms from said poly-crystalline semiconductor layer into said first island region.

10. The method in accordance with claim 1 or 2, wherein said emitter region is formed by a selective impurity diffusion method.

11. The method in accordance with claim 1 or 2, wherein arsenic is used for an emitter impurity.

12. The method in accordance with claim 1 or 2, wherein boron is used for an impurity in the formation of said active base region and said buried resistor layer.

13. The method in accordance with claim 1 or 2, wherein said buried resistor layer is formed in such a manner that implanted atoms for the formation of said buried resistor layer are buried completely inside said second island region.

* * * * *